US009806552B2

(12) United States Patent
Brannick et al.

(10) Patent No.: US 9,806,552 B2
(45) Date of Patent: Oct. 31, 2017

(54) ANALOG/DIGITAL CONVERTER WITH CHARGE REBALANCED INTEGRATOR

(71) Applicant: Analog Devices Global, Hamilton (BM)

(72) Inventors: Paraic Brannick, Limerick (IE); Colin G. Lyden, Baltimore (IE); Damien J. McCartney, Raheen (IE); Gabriel Banarie, Limerick (IE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/169,981

(22) Filed: Jun. 1, 2016

(65) Prior Publication Data
US 2017/0237268 A1     Aug. 17, 2017

Related U.S. Application Data

(60) Provisional application No. 62/295,288, filed on Feb. 15, 2016.

(51) Int. Cl.
*H03M 1/60* (2006.01)
*H02J 7/00* (2006.01)
(Continued)

(52) U.S. Cl.
CPC ............ *H02J 7/007* (2013.01); *G04F 10/005* (2013.01); *H03M 1/201* (2013.01); *H03M 1/50* (2013.01); *H03M 1/60* (2013.01); *H02J 7/345* (2013.01)

(58) Field of Classification Search
CPC ......... H02J 7/007; H02J 7/345; G04F 10/005; H03M 1/60; H03M 1/50; H03M 1/201
(Continued)

(56) References Cited

U.S. PATENT DOCUMENTS 4,998,109 A * 3/1991 LeChevalier .......... H03M 1/54
341/155
5,189,419 A    2/1993 Lyden
(Continued)

OTHER PUBLICATIONS

Bonazzola, G. C., et al., "A VLSI circut for charge measurement of a strip ionization chamber1", Nuclear Instruments & Methods in Physics Research; 409, (1998), 336-338.
(Continued)

*Primary Examiner* — Brian Young
(74) *Attorney, Agent, or Firm* — Schwegman Lundberg & Woessner, P.A.

(57) ABSTRACT

A charge rebalancing integration circuit can help keep an output node of a front-end integration circuit within a specified range, e.g., without requiring resetting of the integration capacitor. The process of monitoring and rebalancing the integration circuit can operate on a much shorter time base than the integration time period, which can allow for multiple charge balancing charge transfer events during the integration time period, and sampling of the integration capacitor once per integration time period, such as at the end of that integration time period. Information about the charge rebalancing can be used to adjust subsequent discrete-time signal processing, such as digitized values of the samples. Improved dynamic range and noise performance is possible. Computed tomography (CT) imaging and other use cases are described, including those with variable integration periods.

25 Claims, 7 Drawing Sheets

(51) Int. Cl.
*G04F 10/00* (2006.01)
*H03M 1/20* (2006.01)
*H03M 1/50* (2006.01)
*H02J 7/34* (2006.01)

(58) Field of Classification Search
USPC .................................................. 341/166, 155
See application file for complete search history.

(56) References Cited

U.S. PATENT DOCUMENTS

| | | | | |
|---|---|---|---|---|
| 5,206,650 | A * | 4/1993 | Parle .................. | H03M 1/38 341/155 |
| 5,652,586 | A * | 7/1997 | Chuh .................. | H03M 1/60 341/155 |
| 9,197,233 | B2 * | 11/2015 | Gaalema ................. | H03M 1/12 |
| 9,325,339 | B2 * | 4/2016 | Cowley ............... | H03M 1/0626 |
| 9,503,121 | B2 * | 11/2016 | Bach; Elmar ......... | H03M 3/464 |
| 9,571,115 | B1 * | 2/2017 | Beukema ............ | H03M 1/1023 |
| 2010/0049459 | A1 | 2/2010 | DeGeronimo | |

OTHER PUBLICATIONS

Leslie, T. C., et al., "An Improved Sigma-Delta Modulator Architecture", Circuits and Systems, IEEE International Symposium May 1-3, 1990, (1990), 372-375, vol. 1.

Leslie, T. C., et al., "Sigma-delta modulators with multibit quantising elements and single-bit feedback", IEEE Proceedings-G, vol. 139, No. 3, (1990), 356-362.

Mazza, G., et al., "A 64-channel wide dynamic range charge measurement ASIC for strip and pixel ionization detectors", IEEE, (2004), 964-968.

* cited by examiner

ANALOG/DIGITAL CONVERTER WITH CHARGE REBALANCED INTEGRATOR

CLAIM OF PRIORITY

This patent application claims the benefit of priority of U.S. Provisional Patent Application Ser. No. 62/295,288 entitled ANALOG/DIGITAL CONVERTER WITH CHARGE REBALANCED INTEGRATOR, which was filed on Feb. 15, 2016, which is hereby incorporated herein by reference in its entirety.

BACKGROUND

Analog-to-digital signal conversion is useful for many signal processing applications, for example, interfacing with a photodiode sensor in a computed tomography (CT) imaging scanner.

Lyden et al. U.S. Pat. No. 7,136,005, entitled ACCURATE LOW NOISE ANALOG TO DIGITAL CONVERTER SYSTEM describes an analog-to-digital converter system that includes an integrator circuit front-end to an analog-to-digital converter circuit. An integration capacitor of the integrator circuit is reset in response to one or more comparators coupled to the output of the integrator detecting that the integrator output voltage is about to leave a designated output voltage range of the integrator circuit.

DeGeronimo U.S. Pat. No. 8,260,565, entitled HIGH DYNAMIC RANGE CHARGE MEASUREMENTS mentions a charge amplifier for use in radiation sensing including selectively diverting charge.

G. Mazza et al. "A 64-channel wide dynamic range charge measurement ASIC for strip and pixel ionization detectors," Nuclear Science Symposium Conference Record, 2004 IEEE, p. 964-968, mentions a charge balancing integration technique.

G. C. Bonazzola et al. "A VLSI circuit for charge measurement of a strip ionization chamber," Nuclear Instrumentation and Methods in Physics Research A 409 (1998), p. 336-338, mentions a charge transfer technique in an instrument to measure the beam intensity in hadron therapy cancer treatments.

OVERVIEW

Analog-to-digital signal conversion is useful for many signal processing applications, for example, interfacing with a photodiode sensor in a computed tomography (CT) imaging scanner. The present inventors have recognized, among other things, that a problem to be solved in interfacing a sensor or other input signal to an analog-to-digital converter (ADC) circuit can arise in an integrator circuit that can serve as a front-end circuit to the ADC circuit to integrate charge or current from CT imaging sensor or other circuit into a voltage signal that can be sampled by the ADC circuit and converted to a digital signal value.

FIG. 1 shows an example of portions of a CT imaging system 100. In an example, an X-ray source (not shown) can emit X-rays that can be passed through a patient. On the opposite side of the patient, these X-rays can be incident on an X-ray receiver 102. The X-ray receiver 102 can convert the incident X-rays into electrical charge, such as via an indirect or direct technique. An integrator circuit 104 can accumulate the electrical charge that results from the incident X-rays over time. The accumulated electrical charge can be converted by the integrator circuit 104 into a resulting electrical voltage signal that is representative of the attenuation of the patient tissue or other material through which the X-rays passed.

In an indirect conversion example, the X-ray receiver 102 can include a scintillator (not shown) that can convert incident X-ray photons into light. This light can then be applied to a photodiode 106 sensor, which can be connected to an input of the integrator circuit 104. The charge into the integrator circuit 104 can pass through an input switch 103 and onto the input node 105 at an inverting input of an amplifier circuit 109. Such charge into the integrator circuit 104 can be integrated onto an integration capacitor 108 over a period of time, which results in a change in analog signal voltage on the output node 110 of the amplifier 109 of the integrator circuit 104. The accumulated X-rays, which can be represented by a change in voltage at node 110, can be determined by sampling the voltage at the output node 110 of the integrator circuit 104 at the start and end of an integration period of the integrator circuit 104. This integration period may be referred to as a "view time" in the context of the CT imaging system 100. The integration capacitor 108 of the integrator circuit 104 can be reset after each integration period, such as by switches 112A-B, e.g., after the analog signal voltage value at the output node 110 of the integrator circuit 104 is sampled by an ADC circuit 114 for conversion into a digital signal value at ADC output 116, such as for being provided to a digital signal processing (DSP) circuit 118. Resetting the integration capacitor 108 of the integrator circuit 104 (e.g., to zero voltage or other specified fixed voltage across the integration capacitor 108) may help ensure that the analog signal at the output node 110 of the integrator circuit 104 remains operating within the power supply voltage range of the integrator circuit 104.

The present inventors have recognized that an objective in CT imaging may be to protect patient's health, such as by reducing or minimizing the patient's exposure to ionizing radiation (e.g., X-rays). The noise associated with the X-ray receiver 102 can dictate the minimum level of X-ray dose that can be detected. The X-ray intensity needed can be affected by the size of the patient and the associated attenuation. In a multichannel X-ray imaging system, such as for acquiring an array of imaging data, as X-ray intensity increases, those channels that are exposed to the full intensity of the X-ray source need to cope with a larger input signal. For the integrator circuit 104, this can involve using a larger integration capacitor 108 to deal with the higher levels of incoming charge from the detected X-rays that were converted to electrical charge by the photodiode 106. But increasing the size and capacitance value of the integration capacitor 108 will reduce the gain associated with the integrator circuit 104, which, in turn, will increase the impact of input-referred noise levels resulting from backend noise (which can be modeled conceptually at 120) originating subsequent to the integration circuit 104 in the signal chain. With this signal chain as shown in the approach of FIG. 1, there can be a dependency of noise on input full scale range.

In the approach of FIG. 1, one point to appreciate is that the channel can only be reset once per integration period—and only after the analog signal at the output node 110 of the integrator circuit 104 is sampled. The reset point can be a calibrated point if the reset is sufficiently stable and noise free, or it could be re-measured before starting integration provided that there is sufficient time to achieve this. During the resetting of the integration capacitor 108 of the integrator circuit 104, the photodiode 106 is disconnected from the integrator circuit 104, such as by opening the switch 103, such as to help ensure no loss of charge signal during the reset event. That disconnect time should be kept to a minimum to help ensure minimal charge build up on a parasitic capacitance, $C_{par}$, 107 associated with the X-ray receiver circuit 102 and to inhibit or prevent subthreshold leakage across the photodiode 106 itself.

FIG. 2 shows an example of portions of a CT imaging system 200, which is a variation on the example shown in FIG. 1. In the example of FIG. 2, the integration capacitor 108 of the integrator circuit 104 can be reset only when required. This can be achieved by adding a monitor circuit 202, such as can include monitors, such as comparator circuits 204A-B, to the output 110 of the integrator circuit 104. Each of the comparator circuits 204A-B can compare the analog signal at the output node 110 of the integrator circuit 104 to a respective threshold voltage value, and signal when the analog signal at the output node 110 of the integrator circuit 104 crosses a respective defined threshold voltage value, such as the upper threshold that can be used as a reference input voltage to the comparator 204A, or the lower threshold that can be used as a reference input voltage to the comparator 204B. The state of outputs of the comparators 204A-B can be used by a reset logic circuit 206, such as to determine when the integration capacitor 108 should be reset (such as when the analog signal at the output node 110 of the integrator circuit 104 is about to leave a desired voltage range), and when it's allowed to continue to integrate (such as when the analog signal at the output node 110 of the integrator circuit 104 remains within a desired voltage range). Such conditional or selective resetting of the integration capacitor 108 can have the benefit of reducing potential noise that would otherwise introduced through using resetting function unconditionally between specified integration periods. This approach of FIG. 2 can be useful in a high dynamic range signal chain, as it can help decrease or minimize the noise that may otherwise be introduced by the resetting of the integration capacitor 108 of the integrator circuit 104.

The present inventors have recognized, among other things, that a potential issue with the approaches shown in FIGS. 1-2 can be that value and size of integration capacitor 108 can be determined by the maximum input signal over the defined integration period, e.g., the time between samples of the analog signal at the output node 110 of the integrator circuit 104 by the ADC circuit 114. This can effectively determine the gain of the integrator circuit 104, which, in turn, impacts how well the backend noise 120 can be suppressed when referred to the input of integrator circuit 104 and the input of the signal chain. Less gain through the integrator circuit 104 means a larger impact of backend noise 120 when input-referred to the input of integrator circuit 104 and the input of the signal chain. Because a large integration capacitor 108 would provide less gain through the integrator circuit 104, the input-referred backend noise can be increased.

To address these and other problems, the present document describes below, among other things, a proposed charge rebalancing approach, which can help reduce or remove the dependency between noise and full scale range. As described herein, with charge rebalancing, the analog signal at the output node 110 of the integrator circuit 104 can be monitored during the integration period. When the analog signal at the output node 110 of the integrator circuit 104 deviates outside a range defined by one or more operating thresholds for the integrator circuit 104, a specified, defined, or calibrated quantity of charge can be delivered onto the integration capacitor 108 such as via the node 105 input of the amplifier 109 of the integrator circuit 104. The specified quantity of charge delivered can be of appropriate magnitude and sign to force the analog signal at the output node 110 of the integrator circuit 104 back within a normal operating range of the integrator circuit 104, e.g., without requiring resetting of the integration capacitor 108.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

This document describes, among other things, charge rebalancing an integration circuit to keep an output node of a front-end integration circuit within a specified range, e.g., without requiring resetting of the integration capacitor. The process of monitoring and rebalancing the integrator circuit can operate on a much shorter time base than the integration period, which can allows for multiple charge balancing events (also referred to herein as charge transfer events) to occur during a single integration period, e.g., without resetting the integration capacitor. Information about the charge rebalancing events, such as the number of charge rebalancing events during the integration period, can be recorded.

This information can be used to track the total charge transferred due to charge rebalancing events within the same integration period. This total charge transferred onto the integration capacitor during the same integration period can be estimated as the sum of the charge from rebalancing, plus the residue charge resulting in the change in voltage on the integrator output between the start and end of the integration period.

Figure 3:
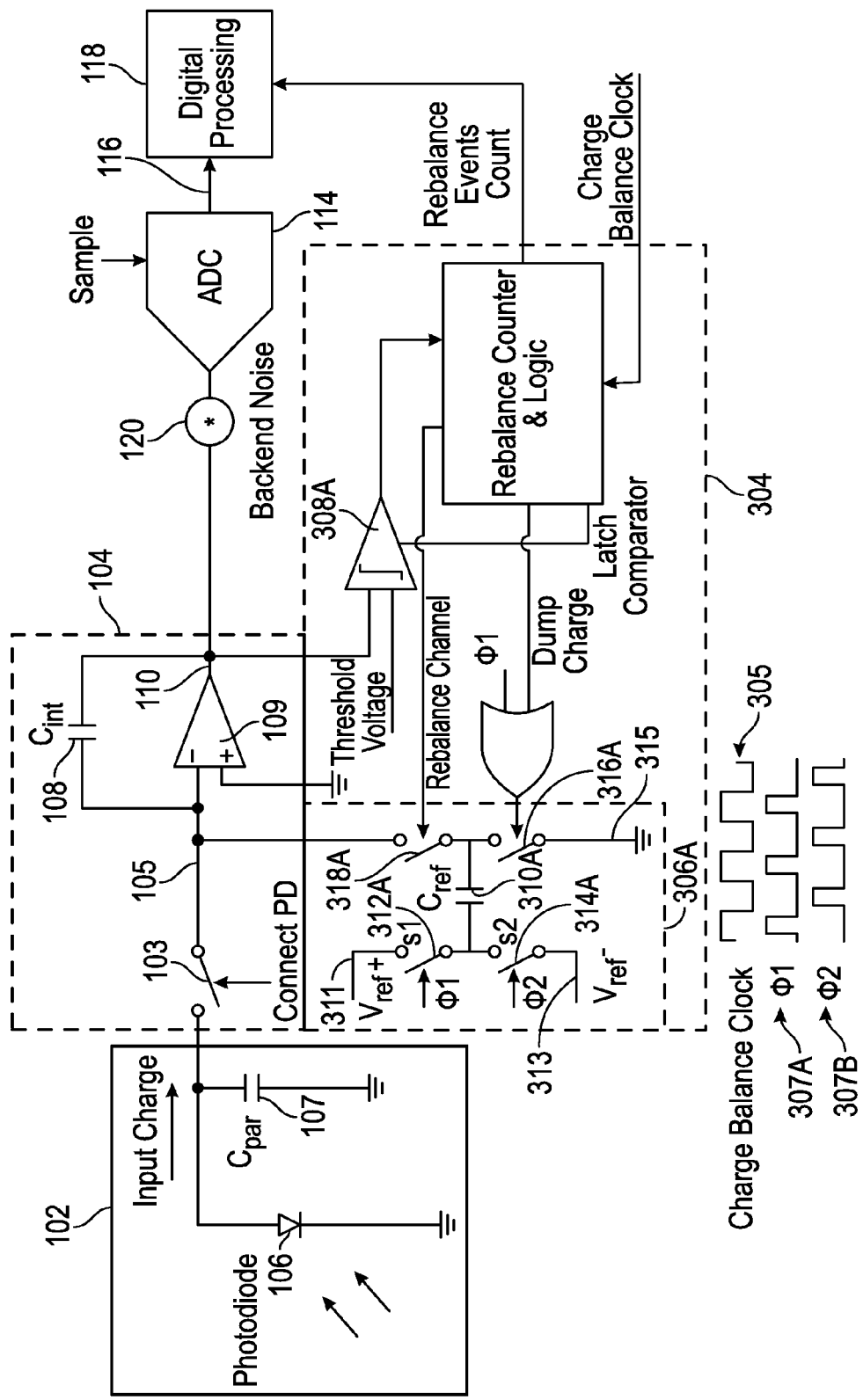
FIG. 3 shows an example of portions of a CT imaging system, such as in which charge rebalancing can be used to maintain integration circuit output voltage at node within a specified range.

FIG. 3 shows an example of portions of a CT imaging system 300, such as in which charge rebalancing can be used to maintain integration circuit output voltage at node 110 within a specified range, such as during an integration period without requiring resetting the integration capacitor 108. The portions of the CT imaging system 300 shown in FIG. 3 can represent one channel in a multi-channel CT system. For example, a discrete-time or digital circuit such as the ADC circuit 114 and the DSP circuit 118 can be shared between multiple channels. For example, a multiplexer circuit can be included in the signal path before the ADC circuit 114 to allow time-multiplexing of multiple signals from multiple front-end circuits onto the ADC circuit 114 for processing. In an illustrative computed tomography example, each channel multiplexed onto the ADC circuit 114 can provide a corresponding front-end circuit for interfacing with a corresponding one of a plurality of such photodiodes included in a CT X-ray receiver circuit 102.

FIG. 3 shows an example focused on rebalancing the integration capacitor 108 of the integrator circuit 104 in a particular direction. The photodiode 106, which can be operating in a photovoltaic mode, can be coupled via the switch 103 to the node 105 of the integrator circuit 104. The integrator circuit 104 can include an integration capacitor 108, of a specified integration capacitance value, in the feedback path between the output node 110 of the amplifier 109 and the node 105 at the inverting input of the amplifier 109.

A monitor circuit can be used to monitor the voltage at the output node 110. The monitor circuit can compare the voltage at the output node 110 to at least one threshold voltage, such as to a specified first threshold voltage, such as using a comparator circuit 308A. The comparator 308A can include a clocked latched comparator circuit such as can provide a clock-synchronized comparison of the voltage signal at the output node 110 of the integrator circuit 104 The threshold voltage can represent a desired signal level limit of the voltage at the output node 110. When the comparator circuit 308A determines that the voltage at the output node 110 crosses the desired signal level limit, a charge rebalancing event can be triggered, such as to help induce the voltage at the output node 110 toward re-crossing the desired signal level limit in the other direction. This can bring the voltage at the output node 110 back within the desired signal range. This charge rebalancing can occur during the integration period, e.g., between sampling instances of the integration capacitor 108.

Although FIG. 3 illustrates a single comparator circuit 308A, such as for comparing the voltage at the output node 110 to the specified first threshold voltage, a second comparator circuit 308B (not shown) can also similarly be included, such as for comparing the voltage at the output node 110 to a specified second threshold voltage, which can represent the other desired signal level limit of the voltage at the output node 110, such as where it is desired to maintain the voltage at the output node 110 between these limits. In an example, when either of these comparators 308A-B are tripped, a charge rebalancing event can be initiated in the appropriate direction, such as to help induce the voltage at the output node 110 to remain within a desired operating range, such as within the operating range of the positive and negative power supplies providing power to the integrator circuit 104. This charge rebalancing can occur during the integration period, e.g., between sampling instances of the integration capacitor 108.

In an example, the charge rebalancing of the integration capacitor 108 can be performed using a conditional charge transfer circuit 306A ("charge transfer circuit 306A"). The charge transfer circuit 306A can receive one or more control input signals that can be based upon information about whether either of the comparators 308A-B has been tripped, such as during a particular clock cycle of a charge balance or "refresh" clock signal 305. In response to either of the comparators 308A-B having been tripped, the conditional charge transfer circuit 306A can add or subtract charge on the integration capacitor 108, such as via the node 105 of the amplifier 109 of the integration circuit 104.

Figure 4:
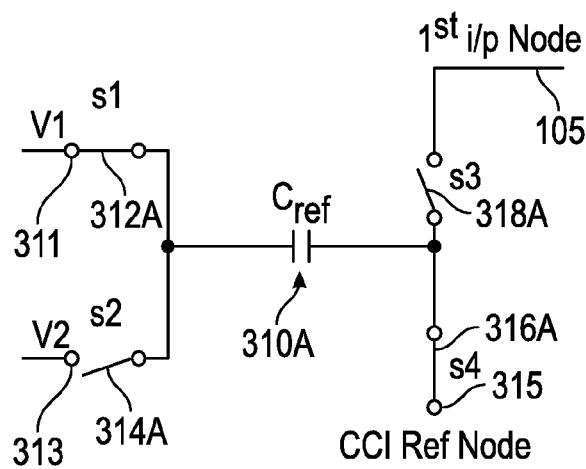
FIGS. 4, 5, and 6 provide a generalized representation of the switch states during first phase, ϕ1, and (conditionally) during the second phase ϕ2.

In an example, the charge transfer circuit 306A can include a switched charge transfer capacitor, $C_{ref}$ 310A. The capacitor $C_{ref}$ 310A can be switched by operating over two phases 307A-B, such as a first phase, $\phi 1$, and a second phase, $\phi 2$, of a refresh clock period provided by the charge balance clock 305. As shown in FIG. 4, during the first phase, $\phi 1$, $C_{ref}$ 310A can be charged to a defined voltage, Vref+, such as by closing the switch 312A to establish an electrical connection between a first terminal of $C_{ref}$ 310A and Vref+ at node 311, and closing the switch 316A to establish an electrical connection between a second terminal of $C_{ref}$ 310A to a reference potential node 315, such as a ground node, with the switch 318A open during the first phase, $\phi 1$, to isolate the second terminal of $C_{ref}$ 310A from the node 105 of the integrator circuit 104, and with switch 314A also open, such as shown in FIG. 4.

Figure 5:
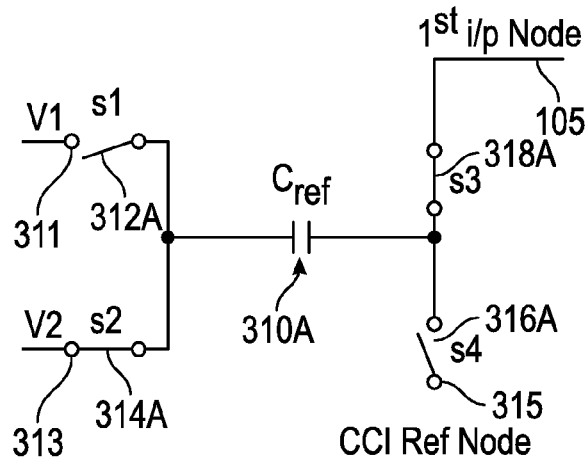
Figure 6:
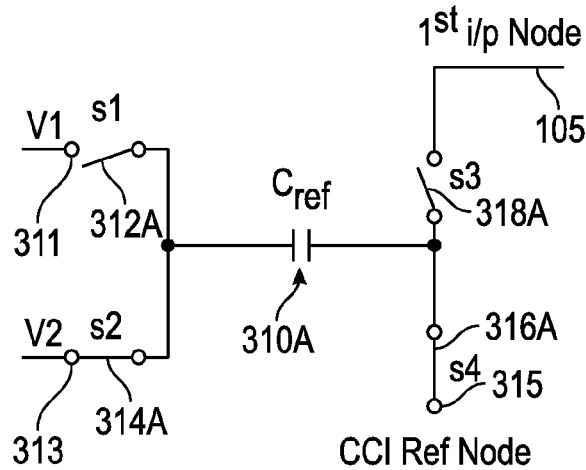

Operation during the second phase, $\phi 2$, such as shown further in FIGS. 5-6, can depend on the state of the comparators 308A-B monitoring the output at node 110 of the integrator circuit 104. If either of the comparators 308A-B indicates that the output node 110 of the integrator circuit 104 is outside the desired allowed operating range, then as shown further in FIG. 5, during the second phase, $\phi 2$, the second terminal of $C_{ref}$ 310A can be connected to the node 105, such as by closing the switch 318A, and the first terminal of $C_{ref}$ 310A can be connected to Vref− at node 313, such as by closing the switch 314A. This can result in a specified quantity of charge (e.g., $Q=C_{ref}V$, determined by charging Car 310A during $\phi 1$) being either added or removed from the integration capacitor 108 by charge transfer via the node 105 of the amplifier 109. This will pull the voltage at the output node 110 of the integrator circuit 104 toward or back within the desired allowed operating range, without requiring resetting of the integration capacitor 108, such as by performing such charge rebalancing one or more times between samplings of the integrator output at node 110, e.g., during the same integration time period.

If the comparators 308A-B indicate (e.g., determined synchronous to the end of the first phase, $\phi 1$) that the integrator output voltage at node 110 is within its desired allowed operating range, then, as shown further in FIG. 6, the charge that was placed onto $C_{ref}$ 310A during $\phi 1$ can optionally be dumped during $\phi 2$ to a defined node (e.g., node 313) other than the node 105. In an example, dumping the charge from $C_{ref}$ 310A during $\phi 2$ can include closing the switches 314A and 316A during $\phi 2$, such as to provide an electrical connection of the first terminal of $C_{ref}$ 310A to Vref− at node 313, and to provide an electrical connection of the second terminal of $C_{ref}$ 310A to a reference node at 315.

In an example, the voltage at Vref– at node 313 can be set equal to the reference voltage at the reference node 315, such that $C_{ref}$ 310A can be discharged during φ2.

This conditional charge transfer process can repeat with the next clock cycle of the charge rebalance clock signal 305, e.g., re-evaluating whether either of the comparators 308A-B has been tripped, such as during or at the end of the next instance of the first phase, φ1, of the charge rebalancing clock cycle 305. Using this information, the conditional charge transfer can be again carried out, such as described above, during φ2.

Example of Switching States for an Transfer Capacitor

FIGS. 4-6 provide a generalized representation of the switch states during first phase, φ1, and (conditionally) during the second phase φ2. Further details regarding an example of such switching are now explained.

In FIG. 4, during the first phase, φ1, switches 312A and 316A can close simultaneously. Then, the charge balance clock 305 can provide a time period in which switches 312A and 316A can remain closed to allow the voltage across the integration capacitor, $C_{ref}$ 310A to settle. Then, switch 316A can open first, such as to sample the defined voltage onto the charge transfer capacitor $C_{ref}$ 310A, thereby establishing a specified quantity of charge stored on the charge transfer capacitor $C_{ref}$ 310A. Then, switch 312A may open.

In FIGS. 5-6, during the second phase, φ2, switch 318A can be closed first (if injecting or removing the specified quantity of charge onto the integration capacitor, Cint, 108A, as shown in FIG. 5) or switch 316A can be closed first (if dumping the charge without such transfer onto the integration capacitor, $C_{int}$, 108A, as shown in FIG. 6). Then, switch 314A can be closed. In this state, the charge balance clock 305 can provide a time period sufficient to either add the charge onto the integration capacitor, $C_{int}$, 108A, such as shown in FIG. 5, or to dump the specified quantity of charge, such as to the reference node 315, such as shown in FIG. 6. Then, the switch 318A can be opened first. Then, if S1 was closed during the first phase, φ1, it can be optionally opened. Then, another instance of operation of the first phase, φ1, can be carried out, such as described.

Figure 7:
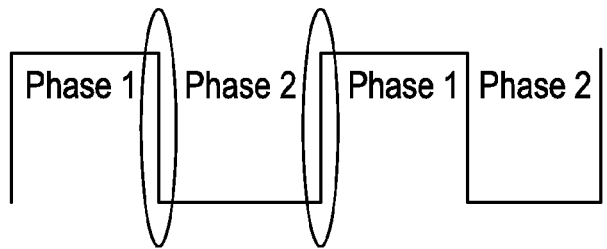
FIG. 7 illustrates an example of using two phases of a single clock cycle to accomplish the desired switching, such as by using multi-level non-overlapping clock signals to accomplish the switching.

As shown in the example of FIGS. 4-6, and as described above, in an example, during the second phase, φ2, switch 314A is only closed when either the charge transfer switch 318A or the dump switch 316A has been closed. For accurate charge sampling and transfer, the other switches should have switched into their appropriate state before the dump switch 316A opens and before the charge transfer switch 318A opens. In an example, this will be at the end of each of the first phase, φ1, and at the end of the second phase, φ2, such as shown in the example of FIG. 7, which illustrates an example of using two phases of a single clock cycle to accomplish the desired switching, such as by using multi-level non-overlapping clock signals to accomplish the switching such as in the manner described.

For a particular channel, the charge transfer circuit 306A can be configured such that a charge transfer event only occurs when directed by a signal based upon an output signal from the first comparator 308A, which can compare the voltage at the output node 110 of the amplifier 109 of the integration circuit 104 to an upper limit. In such an example, the reference voltages $V_{ref+}$ at node 311 and $V_{ref-}$ at node 313 would only see a disturbance (e.g., due to switched capacitive loading) each instance in which it is desired to inject charge on the integration capacitor, $C_{ref}$ 310A, for that particular channel.

Example Using the Same Capacitor for Additive and Subtractive Charge Transfer

FIGS. 4-6 illustrate an example in which charge is being additively transferred on the integration capacitor, $C_{int}$, 108, for a particular channel. In an example, a single charge transfer circuit 306A and a single charge transfer capacitor, $C_{ref}$ 310A, can also be used to subtractively transfer (e.g., remove) charge from the integration capacitor, $C_{int}$, 108, such as when directed by a signal based upon an output signal from a second comparator 308B, which can compare the voltage at the output node 110 of the amplifier 109 of the integration circuit 104 to a lower limit. This can be accomplished by interchanging the operation of switches 312A and 314A during both the first phase, φ1, and the second phase, φ2, when it is desired to subtract charge from the integration capacitor, $C_{int}$, 108, rather than adding charge on the integration capacitor, $C_{int}$, 108. Additional logic circuitry can be included to use the information from the comparators 308A-B to determine whether charge transfer should be additive or subtractive on the integration capacitor, $C_{int}$, 108, and to generate control signals for operating the switches 312A, 314A, 316A, and 318A associated with the single charge transfer circuit 306A, to allow both additive and subtractive charge transfer.

Thus, in terms of the switch operation as shown in FIGS. 4-6, when the comparators 308A-B indicate that additive charge transfer is desired, Vref+ can be conditionally routed to node 311 during both the first phase, φ1, and the second phase, φ2, and Vref– can be conditionally routed to node 313 during both the first phase, φ1, and the second phase, φ2. When the comparators 308A-B indicate that subtractive charge transfer is desired, Vref– can be conditionally routed to node 311 during both the first phase, φ1, and the second phase, φ2, and Vref+ can be conditionally routed to node 313 during both the first phase, φ1, and the second phase, φ2.

When multiple channels are used, however, it is possible that using a single charge transfer circuit 306A, per channel, may result in interchannel noise coupling, such as from the multiple channels being individually coupled to the same reference voltages $V_{ref+}$ at node 311 and $V_{ref-}$ at node 313. With multiple channels, the corresponding activity imposed by the multiple channels on the same reference voltages $V_{ref+}$ at node 311 and $V_{ref-}$ at node 313 can result in channel-to-channel coupling as the number of channels that are injecting charge will change the load on the shared reference voltages $V_{ref+}$ at node 311 and $V_{ref-}$ at node 313. Whether charge is being injected in a particular channel may depend on the input signal to that channel. Therefore, the coupling between channels may be signal-dependent on the input signals to such channels.

One way of overcoming such input-signal dependency is to run the charge transfer circuit 306A continuously as described above, such as to draw and dump charge from the shared reference voltages $V_{ref+}$ at node 311 and $V_{ref-}$ at node 313 on each period of the charge balance clock 305—injecting charge onto the integration capacitor, $C_{int}$, 110, when needed, and dumping the charge away from the integration capacitor, $C_{int}$, 110, such as onto the reference node 315, when charge transfer is not needed. When the shared reference voltages $V_{ref+}$ at node 311 and $V_{ref-}$ at node 313 regularly see identical activity upon each instance of the charge balance clock 305, signal dependency can be overcome with some additional power consumption cost of dumping the charge away from the integration capacitor, $C_{int}$, 110 on instances when charge transfer is not needed.

To overcome such input-signal dependency when both additive and subtractive charge transfer is desired for a particular channel, a similar second charge transfer circuit 306B can be included in parallel with the first charge transfer circuit 306A, shown in FIG. 3.

Separate Additive and Subtractive Charge Transfer Circuits Example

Figure 8:
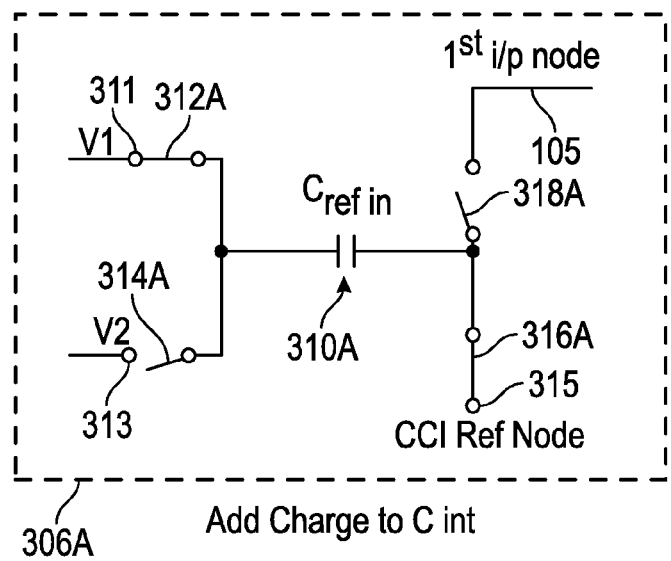
FIG. 8 shows an example of two parallel charge transfer circuits, during the first phase, ϕ1, as similarly illustrated for the case of a single charge transfer circuit in FIG. 4.
Figure 8:
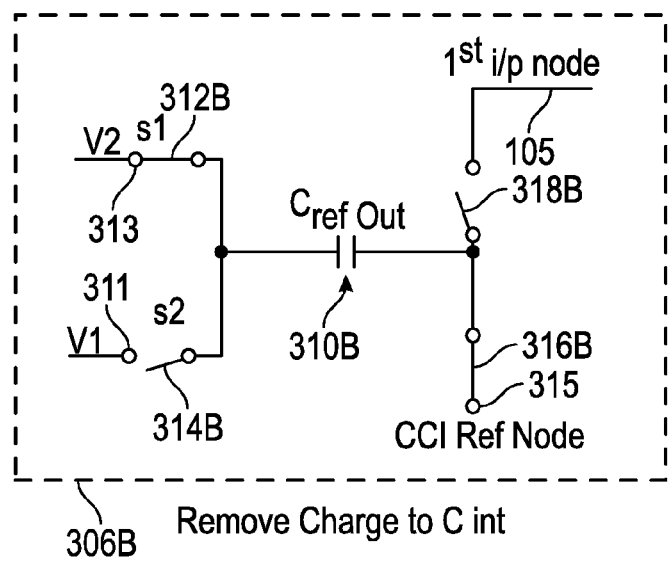

FIG. 8 shows an example of two parallel charge transfer circuits 306A-B, during the first phase, φ1, as similarly illustrated for the case of a single charge transfer circuit 306A in FIG. 4. As shown in FIG. 8, separate charge transfer capacitors, Cref in, 310A, and Cref out, 310B can respectively be provided by the corresponding separate charge transfer circuits 306A-B, together with respective switches. The interconnections to reference voltages $V_{ref+}$ at node 311 and $V_{ref-}$ at node 313 are reversed in the charge transfer circuit 306B, as compared with those in the charge transfer circuit 306A. Thus, in the charge transfer circuit 306B, the switch 312B connects to Vref− at node 313, instead of to Vref+ at node 311 as in the charge transfer circuit 306A, and the switch 314B connects to Vref+ at node 111, instead of to Vref− at node 313 as in the charge transfer circuit 306A. Also, the logic circuitry running the charge transfer circuit 306B can be derived from a comparator 308B, which can monitor the amplifier output voltage at node 110 in parallel with the comparator 308A, but comparing instead to a reference voltage at the opposite end of the desired signal range at node 110. Thus, the charge transfer circuits 306A-B can be used together to additively or subtractively transfer charge from the same integration capacitor 108 via the same node 105 of the integrator circuit 104, such as to keep the amplifier output voltage at node 110 within a desired voltage range.

An advantage in using two separate charge transfer capacitors Cref in, 310A and Cref out 310B, to respectively obtain additive and subtractive charge transfer, as opposed to using a single charge transfer capacitor Cref 310, and additional logic circuitry to determine the different connections to which the single charge transfer capacitor Cref 310 is switched during additive and subtractive charge transfers, is that the current drawn from the voltage reference sources providing Vref+ and Vref− is repetitive and not dependent on the state of the comparators and therefore upon the input signal. It also allows the use of different levels of additive and subtractive charge transfer, if desired.

Because the charge transfer capacitors Cref in, 310A and Cref out 310B are physically different instances of capacitors, there may be mismatch in the capacitance value between these two capacitors. This means that the specified quantity of charge additively transferred by one of them may not be exactly equal to the specified quantity of charge subtractively transferred by the other. This can optionally be handled by counting the additive charge transfers during a particular integration period separately from the subtractive charge transfers, and adjusting the digital signal value using information about these two separate counts, rather than keeping a net count of charge transfer events (e.g., rather than keeping a net count of the additive charge transfer events less the subtractive charge transfer events), which may also work, but can be subject to such capacitance value mismatch.

Linearity Enhanced Operation Example

Figure 9:
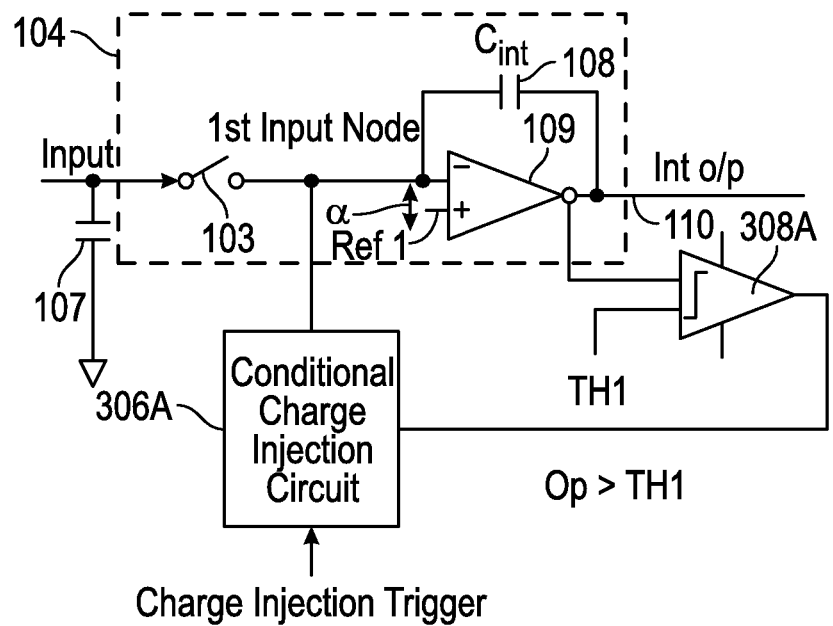
FIG. 9 shows an example of including and using a switch for optionally disconnecting the input signal from its source and for selectively isolating the integration circuit from the source during charge transfer events and sampling events, such as to provide improved linearity.

FIG. 9 shows an example of including and using the switch 103 for optionally disconnecting the input signal from its source (e.g., the X-ray receiver circuit 102) and for selectively isolating from the source the integration circuit 104 during charge transfer events and sampling events such as to provide improved linearity. Without switch 103, one potential issue that could impact linearity performance is when charge transfer events occur at different input signal levels. This could otherwise produce an error voltage, α, between the node 105 and the reference node coupled to the other input of the amplifier 109. The error voltage, a, may be due to the varying signal level when the X-ray receiver circuit 102 or other source is coupled to the node 105 of the integrator circuit 104 in an unswitched manner. Charge transfer events occurring at different input signal levels may impact linearity performance across the input range of the analog-to-digital converter. As the input signal voltage change, the error voltage, α, will also change. Thus the voltage at the node 105 can be at different voltages depending on the input signal to the channel. This may affect the magnitude of the specified quantity of charge transferred on the integration capacitor 108 by the one or more charge transfer circuits 306A-B, introducing some dependency on the value of the input signal.

In an example the gain of the amplifier 109 can be set high enough to make the error voltage, α, small enough that the impact of the error introduced during the charge transfer events can be insignificant. Additionally or alternatively, by including the switch 103 in the input path of the channel, the integrator circuit 104 can be isolated from the X-ray receiver 102 or other input source. Such isolation during the conditional charge transfer events can allow a consistent and constant specified quantity of charge to be transferred on the integration capacitor 108 across all input signal levels. This can be achieved by opening the switch 103 toward the end of the second phase, φ2. This can have the effect of ensuring that the error voltage, α, is the same across all input signal voltages. After the switch 103 has been opened to permit the conditional charge transfer event to occur, the switch 103 can then be closed again to continue on with the integration of the input signal. Charge associated with the input signal is not lost during the time when the switch 103 is open, as such charge is stored on the parasitic capacitor 107 of the input line during the time period when the switch 103 is opened to permit input-signal-independent conditional charge transfer. The charge that was stored on the parasitic capacitor 107 during the time when the switch 103 is open will be pulled into the channel and integrated onto the integration capacitor 108 when the switch 103 is closed again.

Differential Implementation Example

Figure 10A:
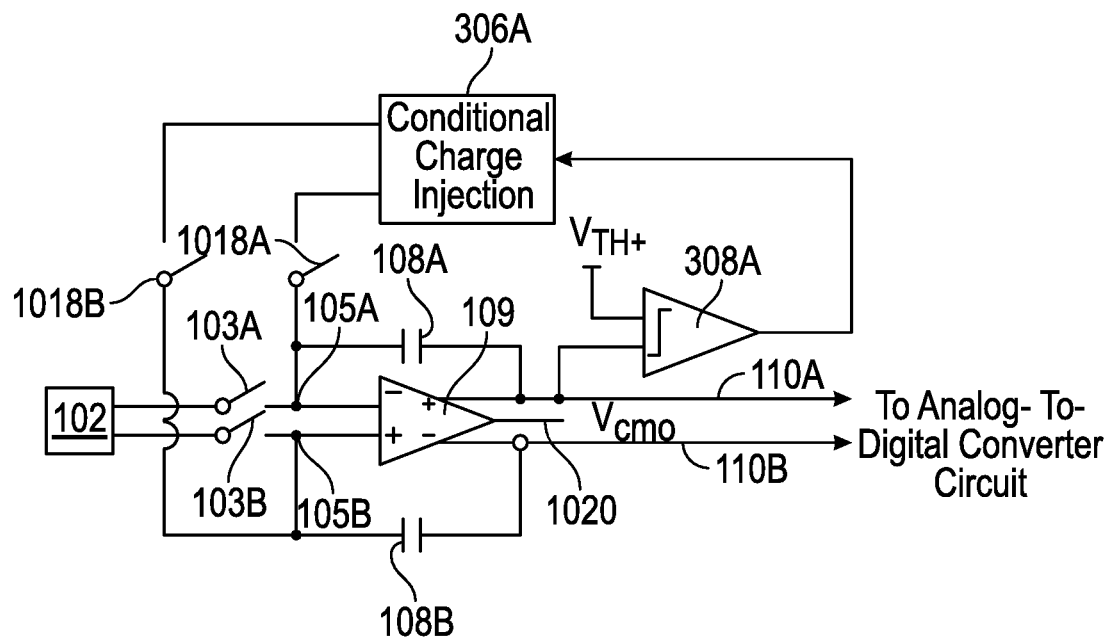
FIGS. 10A-B show examples of portions of a differential implementation extension of the examples such as shown and described above in FIGS. 3-9.

FIG. 10A shows an example of portions of a differential implementation extension of the examples such as shown and described above in FIGS. 3-9. In this example, the conditional charge transfer circuit 306A can include two charge transfer capacitors, Cref, 310A-B, which can operate in parallel during a charge transfer event. In response to an indication from a comparator 308A that an output voltage at node 110A has crossed a first specified threshold value, Cref 310A can be coupled via switch 1018A to additively transfer a specified quantity of charge on the integration capacitor 108A via node 105A, and Cref 310B can be coupled via the switch 1018B to subtractively transfer (e.g., remove) a specified quantity of charge on the integration capacitor 108B via node 105B. This can be performed such that the voltage at node 110A is induced toward re-crossing the first specified threshold value in the other direction and brought back within range. Another comparator 308B can be included for monitoring the voltage at node 110A to indicate whether the voltage at node 110A has crossed a second specified threshold value (e.g., defining the other limit of the voltage range that it is desired that the voltage at node 110A remain within). If so, then Cref 310A can be coupled via switch 1018A to subtractively transfer (e.g., remove) a specified quantity of charge on the integration capacitor 108A via node 105A, and Cref 310B can be coupled via the switch 1018B to additively transfer a specified quantity of charge on the integration capacitor 108B via node 105B. Another option can be to switch the connections such that Cref 310A always adds charge, with switches controlled by appropriate logic to selectively connect Cref 310A to either node 105A or node 105B, as desired.

In the example of FIG. 10A, the comparator circuit 308 can use $V_{TH+}$ as a reference voltage for performing the comparison. If a differential threshold voltage between the differential integration amplifier output nodes 110A-B is defined as $V_{TH}$, then the reference voltage $V_{TH+} = V_{TH} = -V_{CMO}$, where $V_{CMO}$ is a common mode output voltage at node 1020 of the differential integration amplifier 109.

Figure 10B:
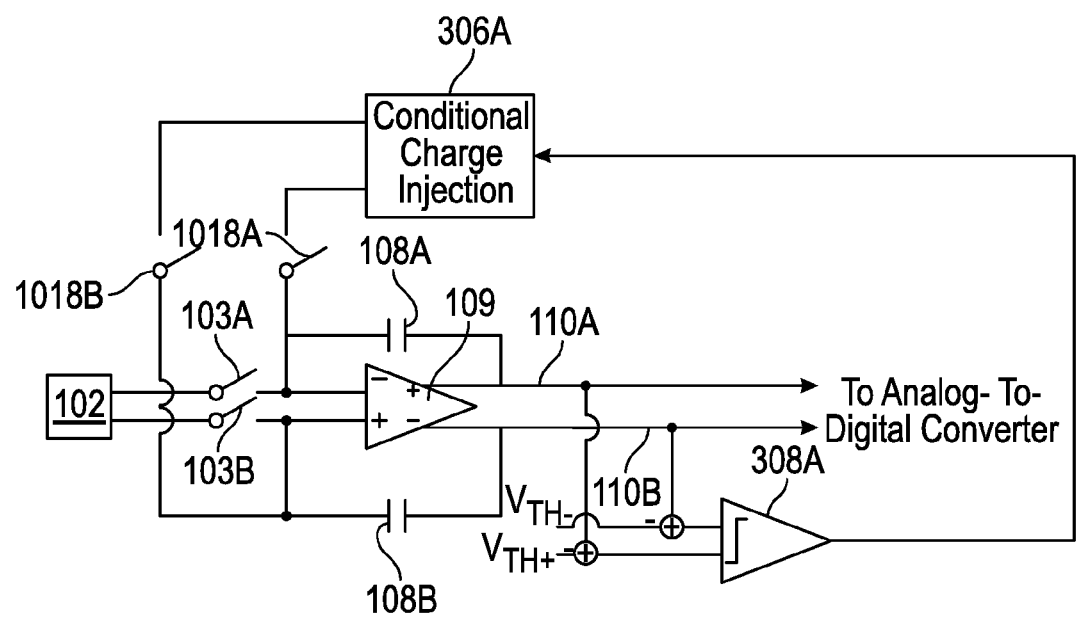

FIG. 10B shows an example in which the differential output voltage between the differential integration amplifier output nodes 110A-B can be compared to a differential threshold voltage $V_{TH} = (V_{TH+} - V_{TH-})$, such as by subtracting $V_{TH+}$ from the voltage at node 110A and applying the result to a first input of a comparator 308A, and subtracting $V_{TH-}$ from the voltage at node 110B and applying the result to a second input of the comparator 308A, with the comparison result provided by the output of the comparator 308A to the conditional charge transfer circuit 306A.

Example of Charge Transfer Combined with Resetting Integration Capacitor(s)

The discussion in this document has described, among other things, performing charge rebalancing of an integration capacitor in an integration circuit, such as to keep an output node within a specified range, by performing additive or subtractive charge transfer events (or both), without requiring resetting of the integration capacitor. It should be understood, however, that this does not mean that resetting the integration capacitor is excluded.

Figure 1:
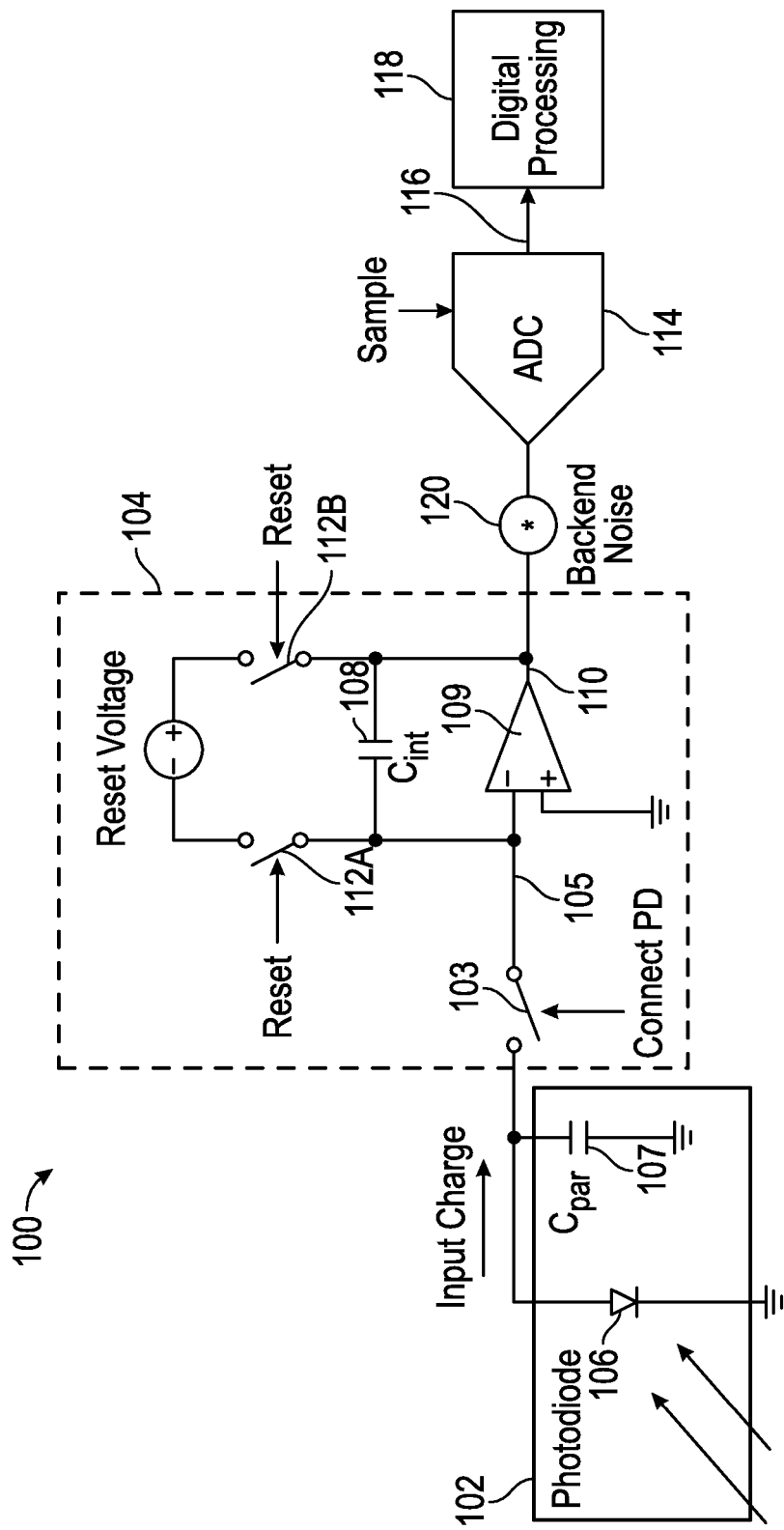
FIG. 1 shows an example of portions of a CT imaging system, such as can include a front-end integration circuit for an analog-to-digital converter circuit.
Figure 2:
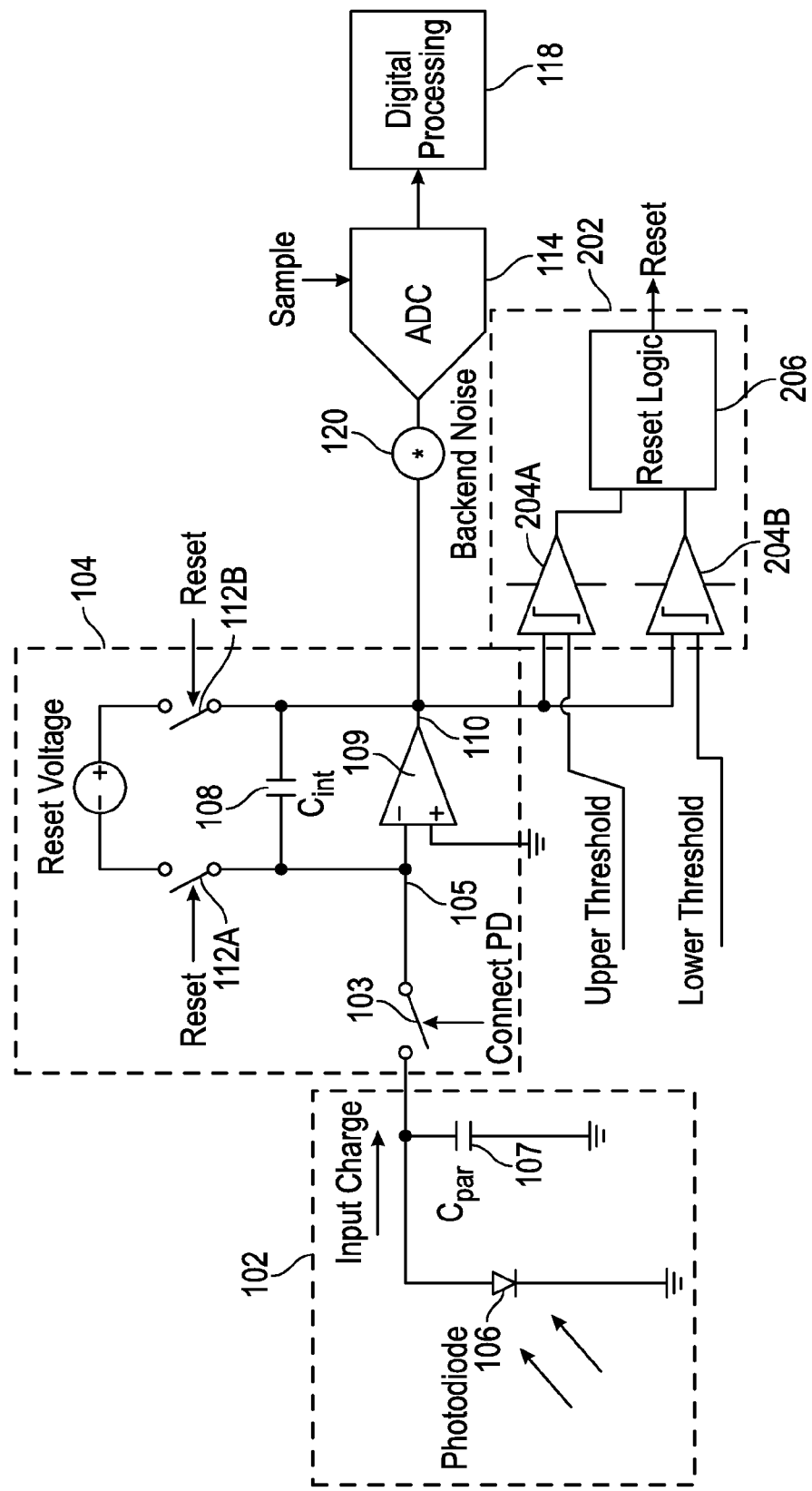
FIG. 2 shows an example of portions of a CT imaging system, such as can include a front-end integration circuit for an analog-to-digital converter circuit, such as for selectively resetting an integration capacitor of the integration circuit.

For example, even though the integration capacitor reset switches 112A-B of FIGS. 1-2 are not shown in FIGS. 3-10, this is merely for clarity in focusing attention on the described charge transfer techniques. Capacitor reset switches 112A-B can similarly be included at the respective terminals of the integration capacitors 108 and 108A-B shown in FIGS. 3, 9, and 10. This can allow the integration capacitors in FIGS. 3, 9, and 10 to be reset between integration periods. The frequency of the resetting between integration periods can be independent of the charge rebalancing frequency, that is, the frequency of conditional charge transfer events.

As a result, the maximum input signal with the charge balance architecture such as shown in the examples of FIGS. 3-10 is now a function of the frequency with which the charge rebalancing (charge transfer) events can occur, combined with the amount of charge that can be transferred on the integration capacitor by a single rebalancing event. The frequency of rebalancing and the period of integration can be completely independent of each other. The size of the integration capacitor 108 and hence the input-referred back-end noise 120 of the signal chain is now a function of frequency of charge rebalancing and magnitude of transferred charge during a rebalancing event. Integration period duration need no longer impact the selection of the value and size of the integration capacitance Cint 108.

In an example, the channel only rebalances its integration capacitor 108 when required. The rebalancing event itself can introduce additional noise into the system. However, the charge transfers associated with the rebalancing events can be carried out in line with the high dynamic range needs of the system. At low input signal levels, rebalancing events are rare. This is because less charge is likely to have been integrated onto the integration capacitor during an integration period at low input signal levels. Consequently, the noise introduced by the events is similarly low at low input signal levels. As the input signal increases, so too can the frequency of rebalancing events and its associated noise. This fits well with systems needing high dynamic range, such as a CT system in which X-ray shot noise can dominate at higher signal levels incident on the X-ray receiver circuit 102.

As described above, in an example the charge transfer capacitor, Cref, 310 can be charged and discharged within every refresh cycle of the charge balance clock, irrespective of state of the comparators 308 monitoring the output node 110 of the integrator circuit 104. Doing so can present a uniform load to the reference voltage source that is recharging the charge transfer capacitor, Cref, 310. Such a uniform load is independent of input signal and can help reduce interchannel coupling between different channels via input-signal dependent noise on the reference voltage source.

In an example, the integration capacitor can be reset only at a power-on-reset (POR) or startup condition of the system, with the charge rebalancing used thereafter, without further resetting of the integration capacitor except upon another POR condition. In an example, the integration capacitor need not be reset at POR or startup, and the charge rebalancing can be used to bring the integration circuit into normal operation, either gradually or quickly, depending on the size of the integration capacitor and the capabilities of the integration amplifier used in the integration circuit.

Calibration Example

Performance level may be influenced by, among other things, the accuracy of matching between the charge transfer capacitor, Cref, 310 and the integration capacitor, Cint, 108. Performance level may also be influenced by the matching between a reference voltage source used by the ADC circuit 114 and a reference voltage source used to provide Vref+ or Vref−, such as can be used to reset the charge on the charge transfer capacitor, Cref, 310. Expressing the specified quantity of charge of the charge transfer events provided for rebalancing the integration capacitor in terms of ADC output codes, and assuming same reference voltage for resetting the charge transfer capacitor, Cref, 310 and for ADC conversion by the ADC circuit 114, can yield the following relation:

$$\text{Charge applied or removed (in ADC codes)} = \frac{C_{ref} \times 2^{ADC\ resolution}}{C_{int}}$$

To overcome process and other limitations, it can be possible to achieve higher resolution by applying a calibration scheme that matches the resolution of the ADC circuit 114 to the charge added to or removed from the integration capacitor 108 by the charge transfer event.

Potential approaches to calibrating this relationship can include:

1. Under zero input current conditions, force the channel to rebalance its integration capacitor by injecting charge during a specific integration period and compare this to an integration period without any rebalancing charge transfer events to determine the appropriate calibration weighting to assign to the rebalancing charge transfer event. This calibration can be performed separately for additive and subtractive charge transfer events.
2. Apply a specified fixed input current, of a value that will result in a rebalancing charge transfer event during a specific integration period, which can be compared to an integration period without such a rebalancing event to determine the calibration weighting to assign to the rebalancing charge transfer event. This calibration can be performed separately for additive and subtractive charge transfer events.

Both calibration techniques (1) and (2) can work on the basis that the input to the channel integration circuit 104 is constant during the calibration. Calibration accuracy can be further improved by averaging or otherwise computing a central tendency of the results of multiple estimates. It may be possible to determine calibration coefficients at higher currents where each integration period has multiple integration capacitor rebalancing charge transfer events. In an example, calibration coefficients can be determined by providing a constant input to the channel over the calibration cycle, and comparing integration intervals in which the number of charge balance events differ.

Various Notes & Examples

Several potential advantages of the above techniques are worth noting. The change from a fixed reset voltage across the integration capacitor to a technique that utilizes a specified fixed charge to rebalance the integrator can allow rebalancing of the integrator at a much higher rate than the sampling of the integrator output. This technique offers a number of advantages, some examples of which are listed below.

1. The integration capacitor, Cint, 108 can now be selected to optimize for suppression of back end noise 120 and need no longer be influenced by full scale signal range needs.
2. Calibration can be easier as the integration capacitor, Cint, 108 can be a single capacitor, and need not constitute an array of capacitance values, each of which may otherwise require calibration.
3. The system user need only operate in a single defined range, and is not required to switch ranges to optimize performance of a CT system.
4. Rebalancing the integrator circuit 104 can be performed without disconnecting from the photodiode 106, thereby reducing or avoiding the risk of signal charge loss.

Other advantages can include having high dynamic range, and having a noise level that is independent of a wide full scale range. While this description has emphasized a target application in computed tomography (CT), however, this approach can be applied to other application areas, for example, such as that employ a photodiode as the input sensor or a signal chain having an input that is in the form of current or charge, which can benefit from higher dynamic range solutions.

Examples of other approaches to reducing backend noise of an ADC with an analog front end (AFE) can include: (1) providing a selectable arrangement of various integration capacitors, which can be selected to provide a minimum capacitance value that can cope with the maximum input signal, and thereby reduce or minimize input-referred backend noise; and (2) oversampling to reduce the integration period during which the integrator must be maintained within its specified operating range, which allows the integration capacitance to be reduced, and reduces the input-referred backend noise, with oversampled samples being accumulated to produce a result over a longer integration period. Both of these approaches can be used in combination with the charge rebalancing techniques described herein. But when either of these approaches are used without the charge rebalancing techniques described herein, the selection of the value of the integration capacitor is still dependent on the maximum input signal available. The present charge rebalancing techniques can avoid being so encumbered.

Another possible approach to achieving lower noise at higher full scale range is to have an auto range function, such as in which a signal-processing channel can be initialized to start its integration period with high gain (e.g., low noise, low full scale range) but has the ability to change to lower gain (e.g., higher noise and higher full scale range) during the integration period. This can require that the reset point for each gain setting is at a fixed/repeatable point and that the relative gain settings are accurately calibrated. A significant challenge with this approach is maintaining linearity of the system when transitioning from high gain range to low gain range. This approach can also be used in combination with the charge rebalancing techniques described herein.

The present description has emphasized examples in which a specified fixed charge can be inserted into or removed from the integrator, such as using a switched capacitor approach. The charge applied during a rebalancing charge transfer event was described in terms of a single capacitor with a fixed reference voltage.

It is possible to extend these illustrative examples to implement a multiple level charge balance approach, such as by using either an programmable array or group of capacitors, or multiple levels of reference voltage, or both. For example, there can be a multitude of comparators (e.g., with different corresponding reference voltages for making their respective comparisons) that can be used to determine whether the signal at the integration amplifier output node crosses any one of a plurality of respective specified threshold voltages. The magnitude of the charge transfer capacitor used to transfer charge on the integration capacitor to induce re-crossing of the corresponding threshold voltage can be programmably selected, such as based upon information about which specified threshold voltage was crossed.

Additionally or alternatively, a defined specified quantity of charge transferred on the integration capacitor of the channel can be implemented via a current source that is connected to provide a specified current for a specified period of time. The current source can include either single or multiple levels of current, which can be accurately calibrated, and which can be bidirectional provide rebalancing corrections in either direction.

The present description has emphasized examples in which the front-end circuit is sampled (e.g., once per integration time period) and fed to an input of an ADC circuit.

Nonetheless, the front-end circuit can be sampled (or sampled and held) and fed to any other discrete-time or digital circuit, other than an ADC circuit, or in combination with an ADC circuit. For example, the integration amplifier output of the front-end circuit described herein can be sampled (e.g., once per integration time period) and fed to a discrete time switched-capacitor filter or amplifier circuit, which, in turn, can then be fed to an ADC circuit. Information about the integration capacitor rebalancing charge transfer events occurring during a particular integration period can be fed to the discrete time switched capacitor circuit, to the ADC circuit, or both, for adjusting operation of one or both such circuits.

Regarding conversion of the residue voltage, the figures have focused on the configuration of a single channel. Configuration into a multichannel example can be achieved by replicating the complete channel, such as shown, and sharing the ADC circuit between or among a multitude of channels, such as using a multiplexing/switching network. This can include using a sample-and-hold network, such as when all channels are desired to be concurrently sampled. The sample-and-hold network may not be needed where such concurrent sampling is not needed. In an example, the ADC circuit 114 can include a successive approximation routine (SAR) ADC. However, it is possible to use other ADC conversion approaches (e.g., pipelined, or sigma-delta, or the like) such as approaches in which the conversion of the residue is completed within an integration period. However, not all ADC conversion approaches are equally well-suited to applications in which the integration period is not fixed, but instead includes some variability, as explained below.

Typically, the input channel integrates the charge into the channel over a defined period of time. The output can therefore be expressed in terms of charge into the channel. In order to determine the charge into the channel, the change in voltage during the integration period, in combination with the integration capacitance, can be used to determine the charge into the channel. One option to determine the change in voltage during the integration period can use digital computation of a difference between the voltages sampled at the start and at the end of the integration period, such as according to the following equation.

Total Charge=Change In Voltage×Integration Capacitance

The output data can easily be adapted to provide an estimation of average current into the channel provided that the integration period is specified, such as using the following equation.

Average Current=Total charge into channel×Integration Period

The channel can also be converted to measure the average voltage on the input by inserting a resistor in series with the input to convert the voltage to a current, which can be integrated over the integration period, such as according to the following equation.

Average voltage on input Average current×Resistance on Input to Channel

One issue with the computed tomography (CT) application is that signal processing and conversion requests to the analog front end (AFE) and analog-to-digital converter (ADC) are not at a fixed frequency. More particularly, CT has been described herein as a particular use case of the present analog/digital converter with a charge rebalanced integrator. The present techniques are particularly well-suited for CT and other applications in which the data rate may not be fixed, but may instead be variable. For example, a CT system can be a partly mechanical system in which a scanner can mechanically circulate about a person at a rate that may have some variability. Therefore, the "view time" interval between successive data points being provided by the CT system can vary considerably, such as by as much as 1 percent, 2 percent, 5 percent, or even 10 percent or more. This would be difficult to accommodate using a sigma-delta converter, which requires a fixed and well-defined integration period, which, in turn, requires a fixed and well-defined data rate.

The present techniques and architectures such as described above, however, can accommodate a variable integration period and a variable data rate, such as can accommodate the 1%, 2%, 5%, or even more than 10% variability in a CT application. The present techniques and architectures can actually vary successive integration times by even more, for example, as much as 100%, 200%, or other desired amount, such as can be desirable for applications other than CT. Moreover, the present techniques and architectures can even be used to vary the integration period in real-time on a successive cycle-to-cycle ongoing basis without experiencing any "memory" of the preceding integration period or integration time. In an example, the charge rebalancing techniques described herein can be used to keep the output of the integrator 109 within a desired range during the particular integration time period, which integration period can be dynamically altered on a cycle-to-cycle basis or otherwise. In an example, the fixed or variable integration time period need not be specified before beginning the integration period. Instead, a new integration period can commence (e.g., upon being triggered by a CT or other application request to sample ADC 114) and can then continue integrating with the integrator 109 being held within a desired range by the charge rebalancing techniques described herein, and the integration can optionally then cease (e.g., upon being triggered by another CT or other application request to sample ADC 114) or can continue. Such an ability to establish the integration time period "on-the-fly", e.g., even during a particular integration time period, can be particularly useful in the CT application or in other applications involving some degree of time-variability, such as for providing an accurate signal sample to the ADC.

No reset signal (e.g., such as shown in FIGS. 1-2) is required, but can be used if desired. Instead, integration periods can be arbitrarily defined, such as by a trigger signal from the CT or other application to sample the ADC 114, and the integration capacitor need not be reset. Instead, the channel voltage at the beginning and end of the arbitrarily defined integration period can be noted, and the number and types of charge rebalancing events occurring during such integration period can be tracked so that the charge associated with the rebalancing can be figured into the computation for the change in channel voltage between the beginning and end of the arbitrarily-defined integration time period.

For example, with the sampling signal (e.g., to sample ADC 114) synchronized to the charge balance clock 305, the present architectures can allow a given channel to be sampled on any charge balance clock 305 period after the previous sample has been converted by the second stage ADC 114. Apart from this, there are no other restrictions as to when the given channel must be sampled to produce a valid accurate result. Therefore, a variable data rate application, such as CT, can be accommodated by the present techniques and architectures, and cannot be easily accommodated by a sigma-delta converter, which is typically restricted to a fixed or very slowly changing sample rate. Using the present techniques and architecture, it is also possible to apply an asynchronous sampling signal, which can then be synchronized to the charge balance clock 305, and an estimate for the charge into the channel can be derived, such as through interpolation of the sampled data.

Some numbered examples of the present subject matter are listed below.

Example 1 can include or use subject matter (such as an apparatus, a system, a method, a means for performing acts, or a device readable medium including instructions that, when performed by the device, can cause the device to perform acts), such as can include or use a front-end interface circuit. The front-end interface circuit can include an integration circuit. The integration circuit can include an integration amplifier circuit. An integration capacitor can be in a feedback path from an integration amplifier circuit output node to an amplifier circuit first input node. The integration circuit can integrate charge from a received input signal onto the integration capacitor over a specified integration time period for being sampled once per integration time period. A conditional charge transfer circuit can be coupled to the amplifier circuit first input node. The conditional charge transfer circuit can include or be coupled to a first comparator circuit such as to determine, such as more often than once per integration time period, whether a signal at the integration amplifier circuit output node crosses a specified first threshold level. The conditional charge transfer circuit can include a charge transfer circuit to transfer, such as when it is determined by the first comparator circuit that the signal at the integration amplifier output node crosses the specified first threshold level, a specified quantity of charge on the integration capacitor via a first input of the integration amplifier in a charge transfer event such that the signal at the integration amplifier output node re-crosses the specified first threshold level in the other direction.

Example 2 can include or use, or can optionally be combined with the subject matter of Example 1, to include or use an analog-to-digital converter circuit. The analog-to-digital converter circuit can be coupled to the integration amplifier circuit output node such as to receive an analog signal and to convert the analog signal into a digital signal. A notification circuit can provide notification of one or more charge transfer events, such as during the same integration time period, to a digital circuit such as to permit adjustment of a digital signal value of the digital signal provided by the analog-to-digital converter circuit such as to account for the one or more charge transfer events during the same integration time period.

Example 3 can include or use, or can optionally be combined with the subject matter of any one of Examples 1-2, such as to include or use the charge transfer circuit being configured to conditionally trigger charge transfer events that can be temporally separated by at least a specified charge transfer period that can be shorter than the specified integration period. The charge transfer events can occur between samples of the integration capacitor. The charge transfer events can occur without resetting the integration capacitor to a specified voltage.

Example 4 can include or use, or can optionally be combined with the subject matter of any one of Examples 1-3, such as to include or use the charge transfer circuit including a specified current source operating for a specified time duration such as to provide the specified quantity of charge transferred by the charge transfer circuit on the integration capacitor via the integration amplifier circuit first input node during the charge transfer event.

Example 5 can include or use, or can optionally be combined with the subject matter of any one of Examples 1-4, such as to include or use the charge transfer circuit including a charge transfer capacitor having a specified charge state, coupled by a switch to the integration amplifier circuit first input node such as to provide the specified quantity of charge transferred by the charge transfer circuit on the integration capacitor via the amplifier first input node during the charge transfer event.

Example 6 can include or use, or can optionally be combined with the subject matter of any one of Examples 1-5, such as to include or use a plurality of comparator circuits, including the first comparator circuit, such as o determine, such as more often than once per integration time period, whether a signal at the integration amplifier circuit output node crosses a specified threshold level corresponding to the particular comparator circuit. The charge transfer capacitor can include a selected one or more capacitors from a group of capacitors to provide a programmably selectable capacitance value of the charge transfer capacitor, such as can be based on which one of the specified threshold levels was crossed by the integration amplifier circuit output node.

Example 7 can include or use, or can optionally be combined with the subject matter of any one of Examples 1-6, such as to include or use the charge transfer events being conditionally determined recurrently such as at a specified charge transfer frequency. The charge transfer capacitor can be discharged to other than the integration capacitor at recurrences at which a charge transfer event is contraindicated.

Example 8 can include or use, or can optionally be combined with the subject matter of any one of Examples 1-7, such as to include or use the conditional charge transfer circuit, which can includes a second comparator circuit such as to determine, such as more often than once per integration time period, whether a signal at the integration amplifier circuit output node crosses a specified second threshold level. A charge transfer circuit can transfer, such as when it is determined by the comparator circuit that the signal at the integration amplifier output node crosses the specified second threshold level, a specified quantity of charge on the integration capacitor such as via a first input of the integration amplifier such as in a charge transfer event such that the integration amplifier output signal re-crosses the specified second threshold level in the other direction.

Example 9 can include or use, or can optionally be combined with the subject matter of any one of Examples 1-8, such as to include or use a notification circuit such as can provide notification of one or more charge transfer events to a digital circuit such as to permit adjustment of a digital signal value provided by an analog-to-digital converter circuit such as to account for the one or more charge transfer events during the same integration period. The notification circuit can include a counter circuit such as to count, such as over an integration period of the integration capacitor, a first count of specified quantities of charge added on the integration capacitor via first amplifier input node and a second count of specified quantities of charge subtracted from the integration capacitor via the first amplifier input node. The notification circuit can include a difference circuit, such as to take a difference of the first and second counts such as to provide an indication of a net specified quantity of charge added to or subtracted from the integration capacitor via the first amplifier input node during the integration period, such as to permit adjustment of a digital signal value, corresponding to the integration period, provided by the analog-to-digital converter circuit to account for the one or more charge transfer events during the same integration period.

Example 10 can include or use, or can optionally be combined with the subject matter of any one of Examples 1-9, such as to include or use the first threshold value being at least one of adjustable or dithered.

Example 11 can include or use, or can optionally be combined with the subject matter of any one of Examples 1-10, such as to include or use a photodiode, such as can be coupled to the front-end interface circuit such that a charge from the photodiode can be integrated onto the integration capacitor during the integration period.

Example 12 can include or use, or can optionally be combined with the subject matter of any one of Examples 1-11, such as to include or use a computed tomography (CT) detection receiver circuit, such as can be coupled to the front-end interface circuit such that charge from the CT detection receiver circuit can be integrated onto the integration capacitor during the integration period.

Example 13 can include or use, or can optionally be combined with the subject matter of any one of Examples 1-12, such as to include or use a multiplexer circuit such as can time-multiplex a back-end discrete time circuit such as between multiple front-end interface circuits.

Example 14 can include or use, or can optionally be combined with the subject matter of any one of Examples 1-13, such as to include or use a system that can include a front-end interface circuit, such as for an analog-to-digital converter circuit. The front-end interface circuit can include an integration circuit. The integration circuit can include an amplifier circuit and an integration capacitor in a feedback path from an amplifier circuit output node to an amplifier circuit first input node. The integration circuit can integrate charge from a received input signal onto the integration capacitor such as over a specified integration time period for being sampled once per integration time period. A conditional charge transfer circuit can be coupled to the amplifier circuit first input node. The conditional charge transfer circuit can include or be coupled to a first comparator. The first comparator can be coupled to the amplifier circuit output node such as to determine, more often than once per integration time period, whether a signal at the amplifier circuit output nodes exceeds a specified first threshold level. A second comparator can be coupled to the amplifier circuit output node such as to determine, such as more often than once per integration time period, whether the signal at the amplifier circuit output node falls below a specified second threshold level. The conditional charge transfer circuit can include a charge transfer circuit such as to transfer, when it is determined by the first comparator circuit that the signal at the integration amplifier output node crosses the specified first threshold level, a specified quantity of charge on the integration capacitor via a first input of the integration amplifier in a charge transfer event such that the signal at the integration amplifier output node re-crosses the specified first threshold level in the other direction. The charge transfer circuit can be configured to transfer, when it is determined by the second comparator circuit that the signal at the integration amplifier output node crosses the specified second threshold level, a specified quantity of charge on the integration capacitor via a first input of the integration amplifier in a charge transfer event such that the signal at the integration amplifier output node re-crosses the specified second threshold level in the other direction. An analog-to-digital converter circuit can be coupled to the amplifier circuit output node such as to receive an analog signal and to convert the analog signal into a digital signal. The charge transfer event can occur without resetting the integration capacitor to a specified voltage. A notification circuit can provide notification of one or more charge transfer events to a digital circuit such as to permit adjustment of a digital signal value provided by the analog-to-digital converter circuit such as to account for a net charge provided to the integration capacitor via the integration amplifier first input node during one or more charge transfer events occurring during the same integration period of the integration capacitor.

Example 15 can include or use, or can optionally be combined with the subject matter of any one of Examples 1-14, such as to include or use receiving an input signal. A charge provided by the input signal can be integrated onto an integration capacitor such as using an integrating amplifier over an integration time period for being sampled once per integration time period. It can be determined, such as more often than once per integration period, whether an integration amplifier output signal exceeds a specified first threshold level. When it is determined that the integration amplifier output signal exceeds the specified first threshold level, a specified quantity of charge can be transferred on the integration capacitor such as via a first input of the integration amplifier such that the integration amplifier output signal no longer exceeds the specified first threshold level. A sample can be provided, such as at the end of the integration time period, of the integration amplifier output signal such as for further discrete-time processing. An indication can be provided, corresponding to the sample, about the transfers of the specified quantity of charge during the integration period associated with that sample such as to allow digital adjustment of a digital signal value corresponding to the sample.

Example 16 can include or use, or can optionally be combined with the subject matter of any one of Examples 1-15, such as to include or use transferring the specified quantity of charge without resetting the integration capacitor to a specified voltage. Further, a digital signal value provided by an analog-to-digital converter circuit in response to a signal value of the amplifier output at the end of the integration period can be adjusted such as to account for instances during an integration period of the transferring of the specified quantity of charge on the integration capacitor via the first input of the integration amplifier.

Example 17 can include or use, or can optionally be combined with the subject matter of any one of Examples 1-16, such as to include or use storing one or more samples from previous integration periods such as for further use in discrete time-signal processing.

Example 18 can include or use, or can optionally be combined with the subject matter of any one of Examples 1-17, such as to include or use transferring the specified quantity of charge at a first input of the integration amplifier such as including discharging a capacitor onto the integration capacitor such as via the first input of the integration amplifier such as on recurrences when it is determined that the integration amplifier output signal exceeds the specified first threshold level, and discharging the capacitor other than onto the integration capacitor via the first input of the integration amplifier on recurrences when it is determined that the integration amplifier output signal does not exceed the specified first threshold level.

Example 19 can include or use, or can optionally be combined with the subject matter of any one of Examples 1-18, such as to include or use, when an integration amplifier output signal falls below a specified second threshold level, transferring a specified quantity of charge on the integration capacitor via the first input of the integration amplifier such that the integration amplifier output signal no longer is below the specified second threshold level.

Example 20 can include or use, or can optionally be combined with the subject matter of any one of Examples 1-19, such as to include or use, the transferring the specified quantity of charge on the integration capacitor without resetting the integration capacitor to a specified voltage, and further comprising adjusting a digitized value of the integration amplifier output signal to account for any transfers of the specified quantity of charge on the integration capacitor via the first input of the integrating amplifier during the integration period.

Example 21 can include or use, or can optionally be combined with the subject matter of any one of Examples 1-20, such as to include or use receiving a computed tomography (CT) imaging input signal. A charge provided by the input signal can be integrated, onto an integration capacitor using an integration amplifier over an integration time period for being sampled once per integration time period, a charge provided by the input signal. It can be determined, such as more often than once per integration period, whether an integration amplifier output signal exceeds a specified first threshold level. When it is determined that the integration amplifier output signal exceeds the specified first threshold level, a specified quantity of charge on the integration capacitor during the integration period can be transferred such as via a first input of the integration amplifier such that the integration amplifier output signal no longer exceeds the specified first threshold level. An indication of the amount of charge added or subtracted from the integration capacitor via the first input of the integration amplifier during the same integration period can be tracked. An analog-to-digital conversion of the amplifier output signal value at the end of the integration period to produce a digital value can be performed. The digital value can be adjusted using the indication of the amount of charge added or subtracted from the integration capacitor via the first input of the integration amplifier during the same integration period, at the end of which the analog-to-digital conversion is performed to produce the digital value.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A system for sampling a wide-dynamic range analog input signal onto an integration capacitor for conversion into a digital signal, the system comprising:
   a front-end interface circuit including:
      an an integration capacitor for sampling the input signal once per an integration time period; and
      a conditional charge transfer circuit, coupled to the integration capacitor,
         to transfer, when the signal on the integration capacitor extends outside a range, a specified quantity of charge on the integration capacitor in a charge transfer event such that the signal on the integration capacitor returns within the range; and
         a notification circuit that provides notification of one or more charge transfer events during the same integration time period to permit adjustment of a digital signal value generated using the signal on the integration capacitor to account for the one or more charge transfer events.

2. The system of claim 1, further comprising:
   an analog-to-digital converter circuit, coupled to the integration capacitor to receive an analog signal and to convert the analog signal into a digital signal.

3. The system of claim 2, wherein the charge transfer circuit is configured to conditionally trigger charge transfer events that are temporally separated by at least a specified charge transfer period that is shorter than the integration period, and wherein the charge transfer event occurs without resetting the integration capacitor to a specified voltage.

4. The system of claim 1, wherein the charge transfer circuit includes a specified current source operating for a specified time duration to provide the specified quantity of charge transferred by the charge transfer circuit on the integration capacitor during the charge transfer event.

5. The system of claim 1, wherein the charge transfer circuit includes a charge transfer capacitor having a specified charge state, coupled by a switch to the integration capacitor to provide the specified quantity of charge transferred by the charge transfer circuit on the integration capacitor via the amplifier first input node during the charge transfer event.

6. The system of claim 5, comprising:
   a plurality of specified threshold levels; and
   wherein the charge transfer capacitor includes a selected one or more capacitors from a group of capacitors to provide a programmably selectable capacitance value of the charge transfer capacitor based on which one of the specified threshold levels was crossed by the integration capacitor signal.

7. The system of claim 5, wherein the charge transfer events are conditionally determined recurrently at a specified charge transfer frequency, and wherein the charge transfer capacitor is discharged to other than the integration capacitor at recurrences at which a charge transfer event is contraindicated.

8. The system of claim 1, wherein the conditional charge transfer circuit is configured to return a signal on the integration capacitor within a range that includes both upper and lower bounds.

9. The system of claim 8, wherein the notification circuit includes:
   a counter circuit to count, over an integration period of the integration capacitor, a first count of specified quantities of charge added on the integration capacitor and a second count of specified quantities of charge subtracted from the integration capacitor; and
   a difference circuit, to take a difference of the first and second counts to provide an indication of a net specified quantity of charge added to or subtracted from the integration capacitor during the integration period, to provide an adjustment value to permit adjustment of a digital signal value, corresponding to the integration period, provided by the analog-to-digital converter circuit to account for the one or more charge transfer events during the same integration period.

10. The system of claim 1, wherein the first threshold value is adjustable and dithered.

11. The system of claim 10, further comprising a photodiode, coupled to the front-end interface circuit such that a charge from the photodiode is integrated onto the integration capacitor during the integration period.

12. The system of claim 10, further comprising a computed tomography (CT) detection receiver circuit, coupled to the front-end interface circuit such that charge from the CT detection receiver circuit is integrated onto the integration capacitor during the integration period.

13. The system of claim 10, comprising a multiplexer circuit that time-multiplexes a back-end discrete time circuit between multiple front-end interface circuits.

14. The system of claim 1, wherein the integration time period is variable between successive integration periods.

15. The system of claim 1, wherein a duration of the integration time period is capable of being specified during that same particular integration time period.

16. A system for sampling a wide-dynamic range analog input signal onto an integration capacitor for conversion into a digital signal, the system comprising:
   a front-end interface circuit for an analog-to-digital converter circuit, the front-end interface circuit including:
      an integration capacitor, wherein the integration circuit integrates charge from a received input signal onto the integration capacitor over an integration time period for being sampled once per integration time period; and
      a conditional charge transfer circuit, coupled to the integration capacitor, the conditional charge transfer circuit including:
         a range bounded by a specified first threshold level and a specified second threshold level;
         a charge transfer circuit to transfer, when the signal at the integration capacitor crosses the specified first threshold level, a specified quantity of charge on the integration capacitor in a charge transfer event such that the signal at the integration capacitor re-crosses the specified first threshold level in the other direction, and, to transfer, when the signal at the integration capacitor crosses the specified second threshold level, a specified quantity of charge on the integration capacitor in a charge transfer event such that the signal at the integration capacitor re-crosses the specified second threshold level in the other direction,
   an analog-to-digital converter circuit, coupled to the amplifier circuit output node to receive an analog signal and to convert the analog signal into a digital signal; and
   wherein the charge transfer event occurs without resetting the integration capacitor to a specified voltage, and further comprising a notification circuit that provides notification of one or more charge transfer events to permit adjustment of a digital signal value provided by the analog-to-digital converter circuit to account for a net charge provided to the integration capacitor during one or more charge transfer events occurring during the same integration period of the integration capacitor.

17. A method comprising:
receiving an input signal;
integrating, onto an integration capacitor over an integration time period for being sampled once per integration time period, a charge provided by the input signal;
determining, more often than once per integration period, whether an integration capacitor signal exceeds a specified first threshold level;
when it is determined that the integration capacitor signal exceeds the specified first threshold level, transferring a specified quantity of charge on the integration capacitor such that the integration capacitor signal no longer exceeds the specified first threshold level;
providing a sample, at the end of the integration time period, of the integration capacitor signal for further discrete-time processing; and
providing an indication, corresponding to the sample, about the transfers of the specified quantity of charge during the integration period associated with that sample to allow digital adjustment of a digital signal value corresponding to the sample.

18. The method of claim 17, wherein the transferring the specified quantity of charge occurs without resetting the integration capacitor to a specified voltage, and further comprising adjusting a digital signal value provided by an analog-to-digital converter circuit in response to a signal value of the integration capacitor at the end of the integration period to account for instances during an integration period of the transferring of the specified quantity of charge on the integration capacitor.

19. The method of claim 17, comprising storing one or more samples from previous integration periods for further use in discrete time-signal processing.

20. The method of claim 19, wherein the transferring the specified quantity of charge includes discharging a capacitor onto the integration capacitor on recurrences when it is determined that the integration capacitor signal exceeds the specified first threshold level, and discharging the capacitor other onto the integration capacitor on recurrences when it is determined that the integration capacitor signal does not exceed the specified first threshold level.

21. The method of claim 17, comprising when an integration capacitor signal falls below a specified second threshold level, transferring a specified quantity of charge on the integration capacitor such that the integration capacitor signal no longer is below the specified second threshold level.

22. The method of claim 21, wherein the transferring the specified quantity of charge on the integration capacitor occurs without resetting the integration capacitor to a specified voltage, and further comprising adjusting a digitized value of the integration capacitor signal to account for any transfers of the specified quantity of charge on the integration capacitor during the integration period.

23. The method of claim 17, wherein the integration time period is variable between successive integration time periods.

24. The method of claim 17, wherein a duration of the integration time period is capable of being specified during that same particular integration time period.

25. A method comprising:
receiving a computed tomography (CT) imaging input signal;
integrating, onto an integration capacitor over an integration time period for being sampled once per integration time period, a charge provided by the input signal;
determining, more often than once per integration period, whether an integration capacitor signal exceeds a specified first threshold level;
when it is determined that the integration capacitor signal exceeds the specified first threshold level, transferring a specified quantity of charge on the integration capacitor during the integration period such that the integration capacitor signal no longer exceeds the specified first threshold level;
tracking an indication of the amount of charge added or subtracted from the integration capacitor during the same integration period;
performing an analog-to-digital conversion of the amplifier output signal value at the end of the integration period to produce a digital value; and
adjusting the digital value using the indication of the amount of charge added or subtracted from the integration capacitor during the same integration period, at the end of which the analog-to-digital conversion is performed to produce the digital value.

* * * * *

UNITED STATES PATENT AND TRADEMARK OFFICE
CERTIFICATE OF CORRECTION

PATENT NO. : 9,806,552 B2
APPLICATION NO. : 15/169981
DATED : October 31, 2017
INVENTOR(S) : Brannick et al.

It is certified that error appears in the above-identified patent and that said Letters Patent is hereby corrected as shown below:

On the Title Page

In Column 2, under "Other Publications", Line 1, delete "circut" and insert --circuit-- therefor In the Claims In Column 23, Line 6, in Claim 1, after "an", delete "an"

In Column 23, Line 9, in Claim 1, after "capacitor,", delete "¶"

In Column 23, Line 41, in Claim 5, after "capacitor", delete "via the amplifier first input node"

In Column 24, Line 48-49, in Claim 18, delete "capcitor" and insert --capacitor-- therefor Signed and Sealed this
Fourth Day of June, 2019

Andrei Iancu
*Director of the United States Patent and Trademark Office*